United States Patent [19]

Dobrovolny

[11] Patent Number: 4,571,560

[45] Date of Patent: Feb. 18, 1986

[54] SWITCHED BANDPASS FILTER

[75] Inventor: Pierre Dobrovolny, North Riverside, Ill.

[73] Assignee: Zenith Electronics Corporation, Glenview, Ill.

[21] Appl. No.: 736,504

[22] Filed: May 21, 1985

[51] Int. Cl.[4] .............................................. H03H 7/01
[52] U.S. Cl. .................................. 333/174; 333/175; 333/176
[58] Field of Search ............... 333/167, 168, 174–177, 333/180; 334/47, 49, 59, 60

[56] References Cited

U.S. PATENT DOCUMENTS

| | | | |
|---|---|---|---|
| 2,151,814 | 3/1939 | Tellegen | 333/176 |
| 3,582,835 | 6/1971 | Walding | 333/174 |
| 4,153,887 | 5/1979 | Poppa | 333/175 X |

Primary Examiner—Marvin L. Nussbaum

[57] ABSTRACT

A switched bandpass filter includes a plurality of triple tuned bandpass filter sections coupled in parallel between an input and an output terminal and complemented by input and output parallel resonant circuits. Each bandpass filter section includes a switch such as a switching diode by means of which the filter section is either rendered active for passing or inactive for suppressing the frequency band to which it is tuned. Portions of the inactive bandpass filter sections contribute to the resulting frequency response with notches at frequencies outside of the passband of the active filter section. Thus, some components of the inactive bandpass filter sections are reused with the active filter section to gain steep out-of-band rejection slopes. In one embodiment, the switched bandpass filter employs only one switching diode per frequency band and, by reusing two-thirds of the filter components, provides a highly efficient switched bandpass filter arrangement.

20 Claims, 4 Drawing Figures

SWITCHED BANDPASS FILTER

BACKGROUND OF THE INVENTION

This invention relates generally to bandpass filters and is particularly directed to a switched bandpass filter for processing a wide band RF signal particularly adapted for use in a frequency converter.

An electronic tuner such as used in a typical RF receiver includes up to three tunable circuits, i.e., a tunable circuit between the antenna input and RF amplifier, a tunable circuit between the RF amplifier and mixer, and a tunable circuit associated with the oscillator. Each of these tunable circuits is simultaneously tuned to a frequency representing the desired station, or channel, in forming ganged tuned circuits. When more than one octave of frequencies is to be covered by the tuner, in addition to tuning, band switching techniques are frequently used to selectively change some elements of each tunable circuit to accommodate the entire desired frequency band. Also many tuners or frequency converters, such as for example those used with CATV systems, operate without a selective front end or mixer protection. As the desired RF bandwidth in this case increases over an octave of frequencies, the number of intermodulation products and the possibility of crossmodulation products increases very fast imposing greater demands upon the tuner.

Prior art approaches to multi-band tuning and mixer protection have generally involved the use of varactor diodes and/or switching diodes in the tuning stages. The varactor diode approach makes use of circuit elements exhibiting a capacitance which is a function of the applied voltage. By varying the DC tuning voltage applied to the varactor diode, its capacitance changes and the frequency to which the resonant circuit is tuned may be adjusted within approximately one octave frequency range as desired. The limitation of the varactor tuning range to approximately 1 octave is overcome frequently by means of switching diodes forming together with the varactor diodes and other mostly inductive components a tuned and bandswitched network. Another limitation in this approach arises from an inherent characteristic of varactor diodes in that they exhibit nonlinear variations in capacitance with changes in the applied RF voltage. This adds more crossmodulation and intermodulation products to that caused by the tuner itself.

Another problem inherent in varactor tuned frequency converters with a relatively high IF frequency (upconverter) is the difficulty of frequency tracking between the RF and oscillator tuned circuits. To overcome this problem complicated analog or digital schemes are used. On the other hand, a simple switching diode approach to band selection generally involves the use of separate bandpass filters which are selectively switched in and out of circuit depending upon the frequency band desired. In this approach, one bandpass filter section is generally active, while the remaining filter sections are switched out of circuit and thus rendered inactive. The majority of circuit components are thus not in use at any given time and there is a high component count for the various filter sections. In addition, more than one switching diode is generally required for each frequency band to allow for the switching in and out of circuit of both the input and the output of each filter section so as to select the circuit for receiving a desired frequency band.

In order to reduce the cross- and intermodulation products in wide band CATV tuners and signal converters, double balanced mixers are frequently employed. However, with the CATV band being expanded into the UHF band, the practical limits of double balanced mixer performance within the CATV tuner have essentially been reached in terms of tradeoff between intermodulation and noise performance. With this large RF bandwidth, mixer intermodulation and noise performance determine the dynamic range of the CATV tuner. The noise figure for a typical frequency converter chain with a mixer, which typically exhibits a conversion loss from 6 to 8 dB, is generally in the range of 10 to 13 dB. Placing a feedback type preamplifier with 10 dB gain in front of the mixer would improve the system's noise figure to 5 to 7 dB with an associated 10 dB decrease of the signal converter's RF processing capability. The latter is generally unacceptable except if an electronic band switch is also placed in front of the mixer state. However, to date this capability is not yet available without employing overly complicated switching arrangements with large numbers of electronic components.

The present invention is therefore intended to overcome the aforementioned limitations of the prior art by providing a switched bandpass filter which is capable of operating over a large bandwidth, employs a minimum number of components by reusing most of the components in the inactive, or bandstop, sections of the filter, and utilizes only a single switching diode in each filter section. The switched bandpass filter of the present invention is particularly adapted for use in a low noise CATV or RF converter for reducing intermodulation and crossmodulation distortion in the mixer stage which is preceded by a wideband preamplifier.

OBJECTS OF THE INVENTION

Accordingly, it is an object of the present invention to provide a switched bandpass filter for operation over a wide RF bandwidth.

It is another object of the present invention to provide a multi-section switched bandpass filter wherein only one section is active for passing a given passband and those sections which are inactive contribute to the resulting frequency response with notch frequencies outside the active band.

Still another object of the present invention is to provide an electronically switched, multi-section bandpass filter wherein the input and output branches of each section suppress out of band frequencies even when the filter section is inactive.

Yet another object of the present invention is to provide a switched bandpass filter particularly adapted for use in an RF signal converter where the filter within each passband exhibits low VSWR and attenuation as well as steep out-of-band slopes.

A further object of the present invention is to provide an electronically switchable RF signal bandpass filter which requires only one switching diode per bandpass filter section.

A still further object of the present invention is to provide a switched bandpass filter for a CATV converter for substantially reducing or eliminating CATV mixer cross- and intermodulation products.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, in which:

BRIEF DESCRIPTION OF THE PREFERRED EMBODIMENT

Figure 1:
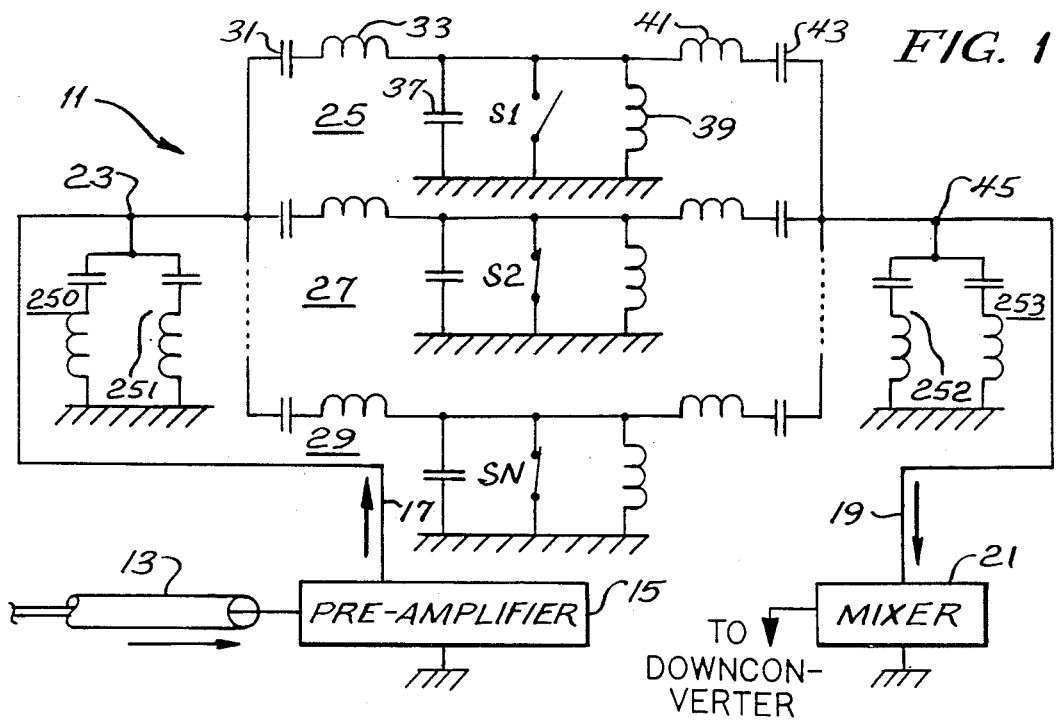
FIG. 1 is a simplified schematic and block diagram of a switched bandpass filter in accordance with the principles of the present invention.

Referring to FIG. 1, there is shown a simplified schematic diagram of a bandpass filter 11 in accordance with the principles of the present invention.

As discussed above in the background of the invention, in a typical RF signal conversion system such as used to receive frequencies over the CATV band, incorporating a feedback type preamplifier with a 10 dB gain in front of the mixer improves the system's noise figure to 5 to 7 dB while at the same time decreasing the signal converter's RF processing capability by approximately 10 dB. Although the switched bandpass filter 11 of the present invention may be used in virtually any wide band RF signal transmitter or receiver, it is particularly adapted for use in front of the mixer of a CATV converter.

The switched bandpass filter 11 shown in FIG. 1 is coupled to a preamplifier 15, although incorporation of a preamplifier between the cable 13 and the switched bandpass filter is not essential for proper operation of the switched bandpass filter. RF signals transmitted on the cable 13 such as in a CATV system are provided to the preamplifier 15 which is coupled by means of an input conductor 17 to an input terminal 23 of the switched bandpass filter. The switched bandpass filter is shown as including first, second and third filter sections 25, 27 and 29 coupled between the input terminal 23 and an output terminal 45. Furthermore, input terminal 23 is shunted with a pair of series resonant circuits 250, 251 while the output terminal 45 is shunted with another pair of series resonant circuits 252 and 253. The operation and functions performed by the various components in the various sections of the switched bandpass filter 11 are described in detail below. The output terminal 45 is coupled by means of an output conductor 19 to a mixer circuit 21. In a conventional CATV converter, the mixer circuit 21 would be coupled to appropriate frequency down converter circuitry (not shown) to effect proper frequency conversion of the received CATV signal. While the present invention is disclosed for use in a CATV converter, it is not limited to this environment but is capable of operating in virtually any wide band RF signal receiver or transmitter.

Each of the first, second and third filter sections 25, 27 and 29 is comprised of an identical arrangement of components and operates in essentially the same manner to either pass or reject selective RF frequencies depending upon the values of the individual components therein. While three filter sections are shown in FIG. 1, the switched bandpass filter of the present invention is not limited to this number of sections. Each filter section represents a separate passband as described in the following paragraphs.

Operation of the first filter section 25 will now be described in detail, it being understood that the following explanation pertains equally as well to the remaining filter sections. The first filter section 25 includes a series resonant input circuit comprised of a capacitor 31 and an inductor 33 as well as a series resonant output circuit comprised of an inductor 41 and a capacitor 43. These resonant circuits are coupled in series between the input and output terminals 23, 45. In addition, the first filter section 25 includes a parallel resonant circuit comprised of a capacitor 37 and an inductor 39 which are connected between the aforementioned series resonant circuits with one terminal and are further connected to neutral ground potential with the other terminal. A switch S1 similarly is connected to a point between the aforementioned series resonant circuits and to the neutral ground potential. From FIG. 1, it can be seen that the second and third filter sections 27, 29 are comprised of similar arrangements of components and each include a respective grounded switch S2 and SN.

A given frequency band is selected in the following manner. If it is desired to pass the frequency band to which the first filter section 25 is tuned, switch S1 is opened and all of the remaining switches, i.e., S2 . . . SN, are closed. With a given switch closed, the parallel resonant circuit associated therewith is shunted to neutral ground potential and those signals in the vicinity of the center frequencies of all inactive filter sections will be filtered out of the signal by the switched bandpass filter 11. With any one switch opened, the combination of all of the aforementioned input and output series circuits together with one parallel resonant circuit associated with the open switch passes those frequencies within the band to which that filter section is tuned.

With a given switch closed, such as shown in FIG. 1 for the case of S2 and SN, the respective parallel resonant circuits associated therewith will be shunted to ground and will thus be removed respectively from the second and third filter sections 27, 29. However, each of the series resonant input and output circuits of the second and third filter sections 27, 29 remain in circuit with the first filter section 25 in processing the signals provided to the input terminal 23. In accordance with the principles of the present invention, all of the series resonant input and output circuits of the inactive sections of the switched bandpass filter are tuned to frequencies which are outside of the passband of the first filter section 25, thus improving the stopband performance of the first filter section.

Therefore, the switched bandpass filter 11 of FIG. 1 is not comprised of a series of isolated, individual resonant circuits each tuned over a predetermined frequency band, but rather is comprised of a plurality of interdependent signal filter sections, only one of which is active at a given time with portions of the remaining inactive filter sections enhancing the stopband frequency response of the active bandpass filter section. In this arrangement, all series resonant circuits which represent two-thirds of the reactive components in each of the filter sections are employed in both the active and inactive states and are thus reused. By choosing a geometric progression for the center frequencies of each passband associated with a given filter section, a degenerate series of equations for the approximate component values of the filter 11 may be derived. A geometric progression for the center frequencies of the various filter sections is given by the following equations:

$$q = \frac{f2}{f1} = \frac{f3}{f2} = \frac{f4}{f3} \quad (1)$$

so that $$\begin{aligned} f2 &= q \cdot f1 \\ f3 &= q^2 \cdot f1 \\ f4 &= q^3 \cdot f1 \end{aligned} \quad (2)$$

$$fN = q^{N-1} f1$$

Finally, series resonant circuits 250 and 252 are tuned to a frequency fo where:

$$fo = \frac{f1}{q}, \quad (3)$$

which is intended to provide an attenuation pole for each frequency response just below the lowest passband. Similarly, series resonant circuits 251 and 253 are tuned to the frequency fN+1 where:

$$fN + 1 = fN \cdot q, \quad (4)$$

thus circuits 250, 251, 252 and 253 will provide consistency to the frequency response for primarily the lowest and for the highest band adding the otherwise missing attenuation pole to the former below the passband and an attenuation pole to the latter above the passband.

Figure 2:
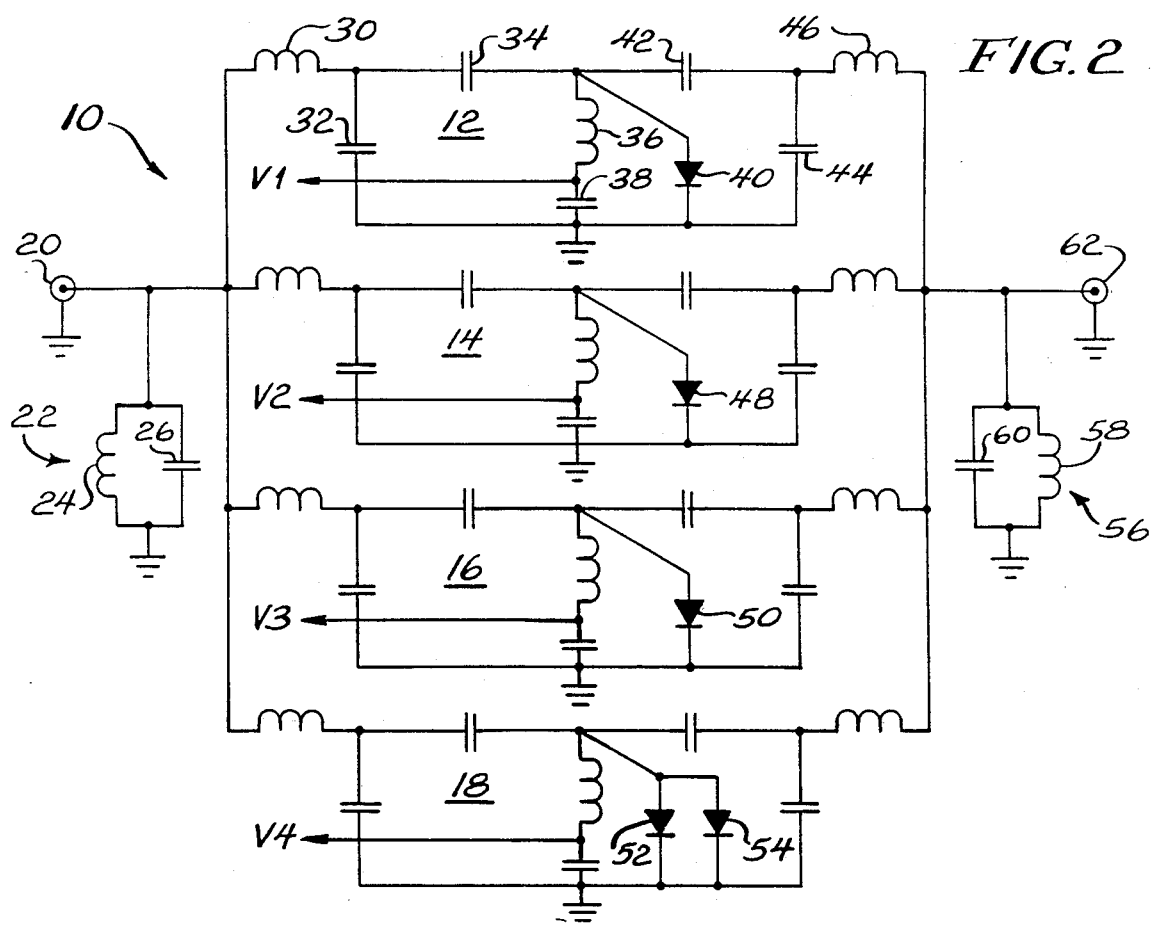
FIG. 2 is a schematic diagram of a working example of a switched bandpass filter incorporating a plurality of switching diodes in accordance with the present invention.

Referring to FIG. 2, there is shown another embodiment of a switched bandpass filter 10 in accordance with the present invention. In the embodiment shown in FIG. 2, there are four bandpass sections 12, 14, 16 and 18 coupled to an input terminal 20 for selectively filtering RF signals provided thereto. In the switched bandpass filter 10, each of the aforementioned bandpass sections includes a respective switching diode(s) 40, 48, 50 and 52, 54 as well as modified input and output series resonant circuits and a modified parallel resonant circuit similarly as in the case of the embodiment of FIG. 1. However, the various resonant circuits in the switched bandpass filter 10 of FIG. 2 assume slightly different configurations than those of FIG. 1 in order to provide improved performance in the electronically switched bandpass filter arrangement shown therein.

Each of the first through fourth bandpass sections 12, 14, 16 and 18 is tuned to a respective passband and is activated by means of a respective switching diode therein. The switching diode 40 within the first bandpass section 12 is responsive to a V1 DC voltage provided thereacross. Similarly, the switching diodes 48, 50 and 52, 54 in the second, third and fourth bandpass sections 14, 16 and 18 are respectively responsive to V2, V3 and V4 DC voltages applied thereacross. The fourth bandpass section 18 includes two switching diodes 52, 54 because this particular filter section is assumed to be tuned to the center frequency of the highest band. In a preferred embodiment, the switched bandpass filter 10 may be designed to interface with a 50 or 75 ohm source and load and can be switched between four states sequentially covering four partially overlapping frequency bands ranging from 50 to 500 MHz with each band covering approximately one octave.

The operation and configuration of the first bandpass section 12 within the switched bandpass filter 10 will now be described, it being understood that the remaining three bandpass sections operate in a similar manner with different component values and are thus only tuned to a different passband. In addition, it should be understood that while only four bandpass sections coupled in parallel between the input terminal 20 and the output terminal 62 are shown in FIG. 2, the present invention is not limited to this number of bandpass sections.

From the figure, it can be seen that only one switching diode per frequency band, with the exception of the fourth bandpass section 18 tuned to the highest frequency, is used. As in the case of the embodiment of FIG. 1, the switched bandpass filter 10 of FIG. 2 reuses some of the reactive components of all inactive bandpass sections into notch circuits outside of the active band in order to improve the stop-band suppression of the active bandpass filter section. The result is an efficient class of band switching network with good in-band matching and attenuation and steep out-of-band slopes. Each of the bandpass filter sections within the switchable bandpass filter 10 includes an input and an output series resonant circuit as well as a parallel resonant circuit. In the case of the first bandpass section 12, the series resonant input circuit is comprised of inductor 30 and capacitors 32, 34. Similarly, the series resonant output circuit of this bandpass section is comprised of capacitors 42, 44 and inductor 46. The parallel resonant circuit is comprised of inductor 36 and capacitors 32, 34, 42 and 44. It is evident that in this embodiment the series and the parallel resonant circuits share the capacitors in a certain way. The component values of each bandpass filter section of the switched bandpass filter 10 of FIG. 2 may be derived from the series and parallel resonant circuits discussed above with respect to FIG. 1 using conventional impedance transformation techniques. These impedance transformations were implemented in the embodiment of FIG. 2 in order to provide the highest possible impedance across each of the switching diodes 40, 48, 50 and 52, 54 of the switched bandpass filter 10 of FIG. 2. This impedance transformation, which otherwise changes neither the frequency response nor the input and output impedances if so desired, minimizes the influence of the parasitic series inductance of each of these diodes when forward biased. Even this approach proved to be insufficient for the highest frequency fourth bandpass section 18 which required two diodes 52, 54 connected in parallel in order to minimize the influence of the parasitic inductance of the switching diodes.

If it is desired to tune to the lowest passband, which in this case is represented by the first bandpass section 12, the switching diodes 48, 50 and 52, 54 are forward biased by providing respective positive control voltages V2, V3 and V4 of sufficient magnitude to render each of these switching diodes conductive. With the switching diode 40 of the first bandpass section 12 reverse biased, capacitors 32 and 34 form a series resonant input circuit with inductor 30 while capacitors 42 and 44 form a series resonant output circuit with inductor 46. In addition, with diode 40 reverse biased, capacitors 32, 34, 42 and 44 form a parallel resonant circuit with inductor 36. Capacitor 38 provides an RF ground for one end of the inductor 36. The values selected for the components of the various aforementioned series and parallel resonant circuits are selected such that the first bandpass section 12 is tuned to the center frequency of the desired passband.

If it is desired to switch to the passband to which the second bandpass section 14 is tuned, diode 40 in the first bandpass section 12 is forward biased by an appropriate positive V1 input applied thereacross, while the forward biasing input V2 applied across diode 48 is changed to reverse biasing, with diode 48 thus rendered nonconductive. The other switching diodes, i.e., diodes 50 and 52, 54, remain conductive with their respective bandpass sections remaining inactive. With diode 48 rendered nonconductive, the electrical configuration and operation of the second bandpass section 14 is identical to that previously described with respect to the first bandpass section 12. With the first bandpass section 12 thus deactivated by rendering diode 40 conductive, capacitors 32 and 34 are arranged in parallel and together with inductor 30 form a series resonant circuit across the input terminals. Similarly, capacitors 42 and 44 are arranged in parallel and, in combination with inductor 46, form a series resonant circuit across the output terminals. The aforementioned parallel resonant circuit of the first bandpass section 12 is thus removed from the filter when it is rendered inactive. The frequency band to which the first bandpass section 12 is tuned is thus no longer provided to the output terminal 62 and its aforementioned series resonant circuits, together with the series resonant circuits of the remaining inactive filter sections, remain in circuit with the active filter section, which in this case is the second bandpass section 14. Each of the aforementioned series resonant circuits of a respective inactive filter section is tuned to a notch frequency within the stopband of the active filter section.

Figure 3:
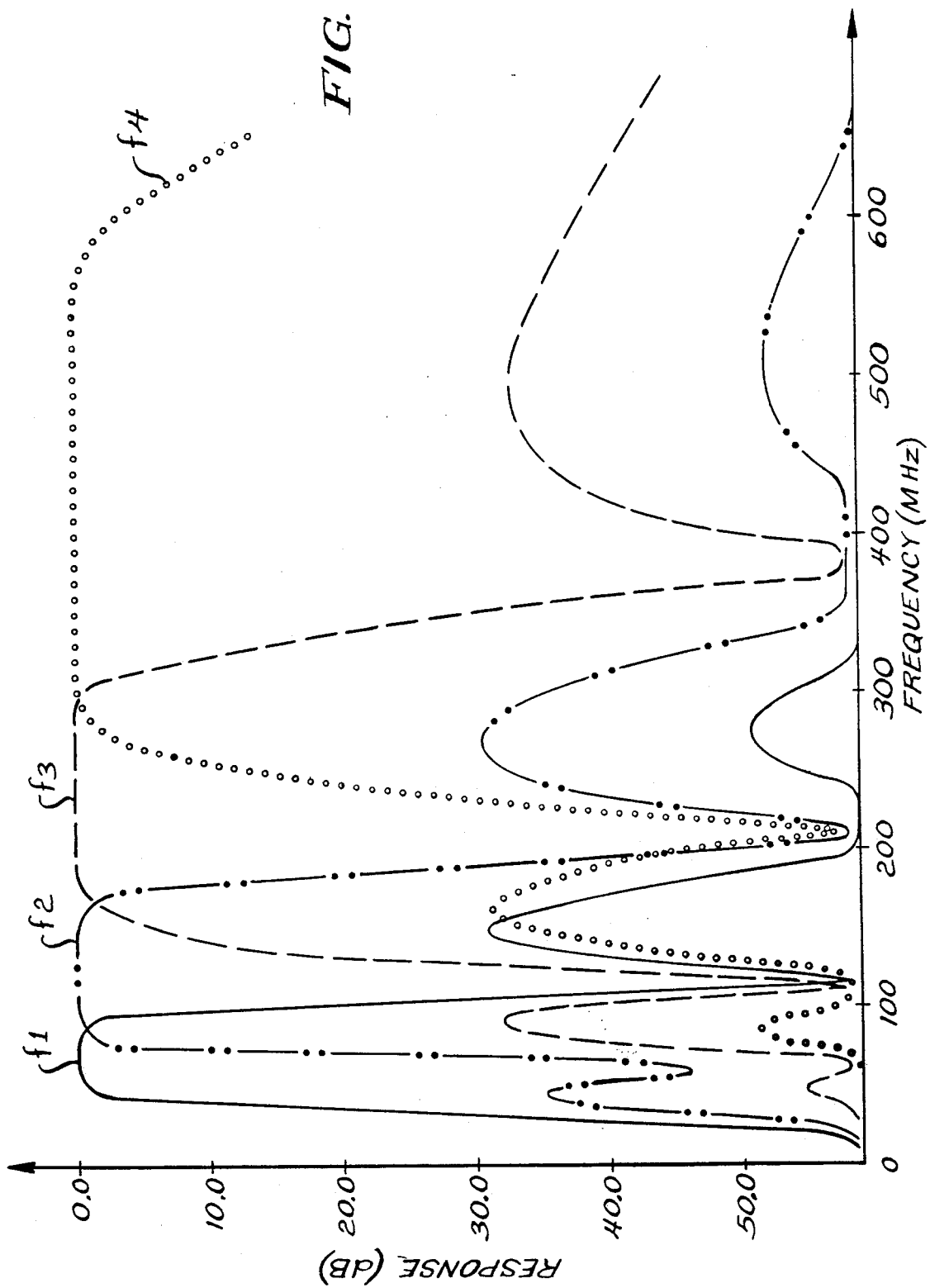
FIG. 3 shows the four overlapping attenuation curves of the switched bandpass filter of FIG. 2 as a function of frequency and of the state of the switching diodes.

Referring to FIG. 3, there is shown a graphical representation of the response of the switched bandpass filter of FIG. 2 over a range of frequencies. In FIG. 3, the frequency range is shown for a typical CATV converter wherein the frequency extends from approximately 50 to more than 500 MHz. As shown in the figure, the frequency response for each of the four configurations of the switched bandpass filter 10 of FIG. 2 is a separate response curve. For example, f1, f2, f3 and f4 represent the respective frequency responses of the four configurations of the switched bandpass filter. From the figure, it can be seen that each of the f2, f3 and f4 response curves exhibits a notch frequency within the passband of f1. Similarly, the passband of f2 coincides with notch frequencies of the f1, f3 and f4 frequency response curves. The same is true of the response curves f3 and f4 which coincide with notch frequencies of the remaining response curves. From the frequency response curves of FIG. 3, it can be seen that the series resonant circuit portions of the inactive bandpass sections cooperate with the active bandpass section to form notch circuits outside of the active band for improved stop-band suppression of the active bandpass section. This improved filtering of the received RF signal is made possible by reusing approximately two-thirds of the components of all of the inactive bandpass sections which remain in circuit with the active bandpass section to provide improved selective filtering of the received signal.

The four tuning and coupling capacitors in the center of each of the four bandpass sections are chosen so that the impedance across each switching diode is the highest obtainable value. This is done in order to minimize the influence of the parasitic series inductance of each forward biased switching diode. In the example described herein, even this proved to be insufficient for the highest band in the range of 500 MHz so that two diodes coupled in parallel, i.e., diodes 52 and 54, were used in the fourth bandpass section 18 in order to minimize the influence of the parasitic inductance of these diodes when forward biased.

Input terminal 20 in FIG. 2 is shunted to ground with parallel resonant circuit 22 replacing the two series resonant circuits 250 and 251 depicted in FIG. 1. Similarly, output terminal 62 in FIG. 2 is shunted to ground with parallel resonant circuit 56 replacing the two series resonant circuits 252 and 253 depicted in FIG. 1. Parallel resonant circuits 22 and 56 are identically tuned to a frequency between the lowest and the highest passband frequencies. The purpose of circuits 22 and 56 from FIG. 2, which are a simpler alternative to the circuits 250, 251, 252 and 253 from FIG. 1, is to improve the passband ripple for the highest and for the lowest passbands of switched filter 10.

Figure 4:
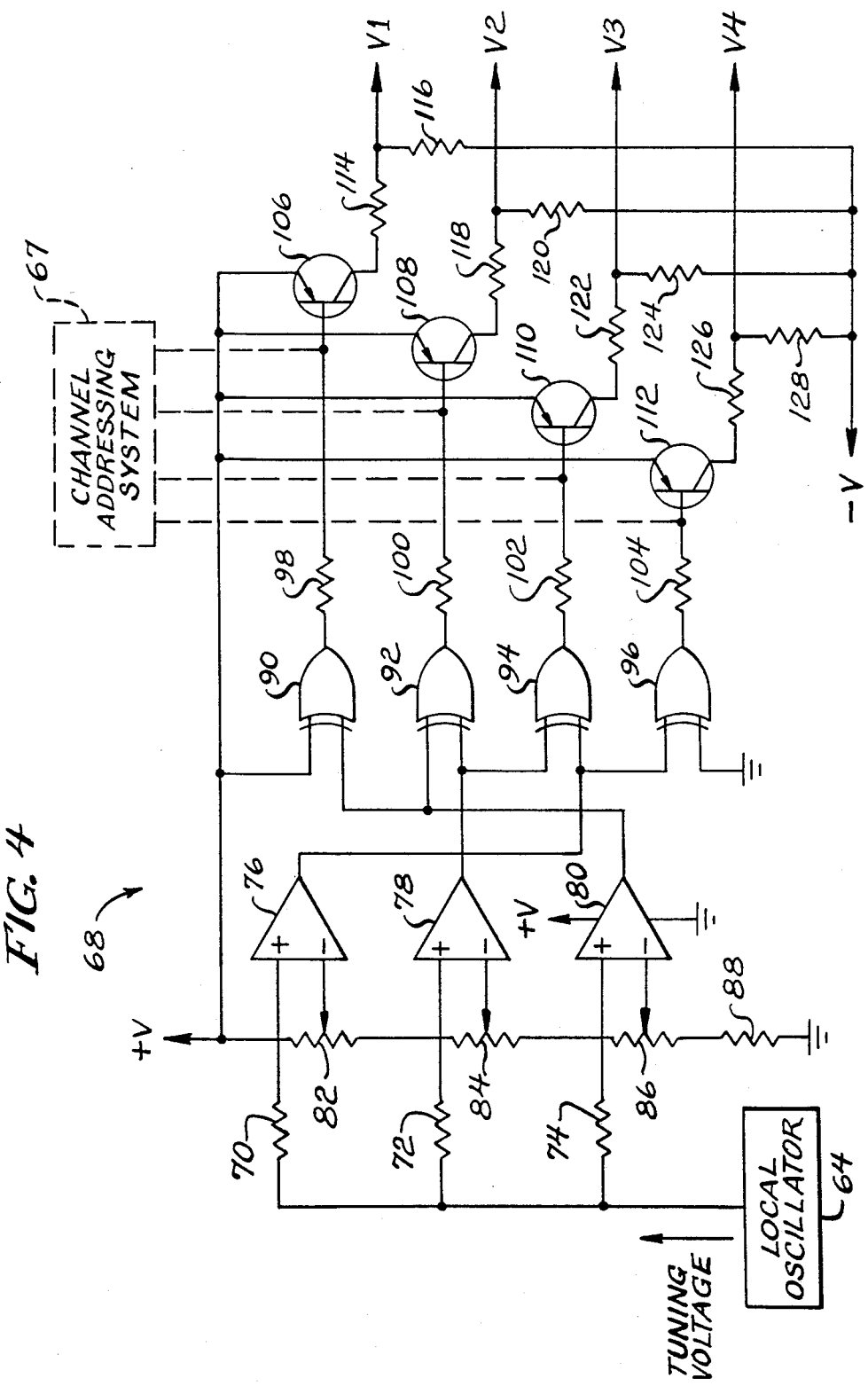
FIG. 4 is a simplified schematic diagram of a switching diode driver circuit for use with the switched bandpass filter of FIG. 2.

Referring to FIG. 4, there is shown in simplified schematic diagram form a switching diode driver circuit 68 for controlling the operation of the various switching diodes in the switched bandpass filter 10 of FIG. 2. The tuning voltage from a local oscillator 64 is provided via respective resistors 70, 72 and 74 to each positive terminal of three comparators 76, 78 and 80. An adjustable voltage is provided from +V via respective potentiometers, 82, 84 and 86 to each negative input terminal of the three comparators 76, 78 and 80. Resistor 88 couples the serial arrangement of the potentiometers 82, 84 and 86 to ground potential. The output of each of the three comparators 76, 78 and 80 is provided to two of four EXCLUSIVE-OR gates 90, 92, 94 and 96. Each of these EXCLUSIVE-OR gates is, in turn, coupled via a respective biasing resistor 98, 100, 102 and 104 to the base of an PNP transistor 106, 108, 110 and 112. The emitters of each of the PNP transistors 106, 108, 110 and 112 are coupled to the +V voltage, which is also provided to one input of EXCLUSIVE-OR gate 90 while the ground potential is provided to one input of EXCLUSIVE-OR gate 96. The respective collectors of transistors 106, 108, 110 and 112 are coupled to a −V voltage by means of a respective voltage dividing network comprised of resistors 114 and 116, resistors 118 and 120, resistors 122 and 124, and resistors 126 and 128. The four outputs of the switching diode driver circuit 68, V1, V2, V3 and V4, are respectively provided to diodes 40, 48, 50 and 52, 54 within the respective bandpass sections.

The switching diode driver circuit 68 operates in the following manner. As indicated above, a tuning voltage from a local oscillator 64 is provided to the positive terminal of each of the three comparators 76, 78 and 80. With four selectable frequency bands, three tuning voltage levels are used to separate these various bands. The crossover point between adjacent bands is sensed by the three comparators 76, 78 and 80 as established by the setting of a respective potentiometer 82, 84 and 86. The three potentiometers are adjusted so that switching between adjacent bands occurs where two adjacent bands overlap. Some hysteresis is assumed to be inherent in the comparators to eliminate switching instability. For example, to pass the lowest frequency band via the first passband section 12, all comparator outputs are 0 and logic gate 90 is the only EXCLUSIVE-OR gate with an output of 1. The output from EXCLUSIVE-OR gate 90 renders PNP transistor 106 nonconductive so that resistor 116 will provide a negative V1 voltage to diode 40 in the first bandpass section 12 rendering it nonconductive. In order to switch from the lowest to the next higher frequency passband, potentiometer 86 is set to the first crossover point such that the output of comparator 80 transitions from a 0 to a 1 resulting in the turn-on of PNP transistor 106 and the turn-off of PNP transistor 108 which provides a negative V2 voltage to the switching diode 48 in the second bandpass section 14 rendering it nonconductive. By thus sequentially providing a 1 output from only one of the four EXCLUSIVE-OR GATES 90, 92, 94, 96 in response to a changing tuning voltage provided thereto, only one of the four bandpass sections in the switched bandpass filter may be selected so as to pass a desired frequency band. In order to receive the highest passband, each of the three comparators 76, 78 and 80 has an output of 1 causing only EXCLUSIVE-OR gate 96 to provide an output 1 to the base of PNP transistor 112 rendering the same nonconductive which, in turn, provides a negative V4 voltage to the fourth bandpass section 18 for rendering the parallel diodes 52, 54 therein nonconducting. As shown in FIG. 4, the collectors of the four PNP transistors 106, 108, 110 and 112, if in the ON state, provide a positive voltage to the respective diodes through resistors 114, 118, 122, 126. The values of these resistors are chosen so that the ON-current through the diodes is limited to a nominal value. Also the resistance of resistors 116, 120, 124 and 128 has to be several times higher than the resistance of resistors 114, 118, 122 and 126. The former resistors 116, 120, 124 and 128 provide negative biasing for the respective diodes in the case when the corresponding transistors are in the OFF-state.

While the present invention has thus far been described in terms of the switching diode driver circuit 68 as being responsive to the local oscillator tuning voltage, a more direct approach could be used to turn the diodes on and off in response to digital outputs from a microprocessor controlled channel addressing system 67 (shown in dotted line form in FIG. 4). If a microprocessor controlled channel addressing system were used with the present invention, its outputs could be provided directly to the respective bases of transistors 106, 108, 110 and 112.

There has thus been shown a switched bandpass filter having a plurality of parallel bandpass sections each including series resonant input and output circuits as well as a parallel resonant circuit coupled therebetween. Each bandpass section further includes a switch coupled across the parallel resonant circuit for grounding the parallel resonant circuit in rendering the bandpass section inactive. Only one of the bandpass sections is active for passing a given frequency band with the series resonant input and output circuit of the inactive bandpass sections complementing the active bandpass section by serving as notch circuits outside of the active band for improving the stop-band suppression of the active bandpass section in providing a low in-band VSWR and attenuation and steep out-of-band slopes.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A switchable filter for selectively passing one of a plurality of frequency bands, wherein each frequency band is characterized as having a center frequency of f1, . . . fn, said switchable filter comprising:

an input terminal to which a signal to be filtered is provided;

an output terminal from which a band filtered signal is provided;

a plurality of grounded parallel resonant circuits;

a plurality of series resonant input circuits each coupling a respective one of said grounded parallel resonant circuits to said input terminal;

a plurality of series resonant output circuits each coupling a respective one of said grounded parallel resonant circuits to said output terminal, wherein each combination of respective series resonant input, grounded parallel resonant, and series resonant output circuits forms a triple tuned bandpass filter section tuned to one of said center frequencies f1, . . . fn; and a plurality of switch means each connected across a respective grounded parallel resonant circuit for shunting all but one of said grounded parallel resonant circuits with the triple tuned filter section associated with the unshunted parallel resonant circuit tuned to the center frequency of a desired frequency band, wherein the series resonant input and output circuits of the shunted triple tuned bandpass filter sections are tuned to respective notch frequencies outside the desired frequency band.

2. The filter of claim 1 wherein each series resonant input and output circuit includes at least one capacitor and at least one inductor coupled in series.

3. The filter of claim 1 wherein each grounded parallel resonant circuit includes at least one capacitor and at least one inductor coupled in parallel across a respective switch means.

4. The filter of claim 3 wherein each switch means is coupled in parallel with a respective grounded parallel combination of said at least one capacitor and said at least one inductor.

5. The filter of claim 1 wherein each of said switch means includes a single switch within a given triple tuned bandpass filter section.

6. The filter of claim 5 wherein each single switch includes a switching diode coupled to biasing means for turning said switching diode ON in rendering its associated triple tuned bandpass filter section inactive and for turning said switching diode OFF in rendering its associated triple tuned bandpass filter section active so as to pass a desired frequency band.

7. The filter of claim 6 wherein each triple tuned bandpass filter section further includes impedance enhancement means for minimizing the influence of the parasitic series inductance of a switching diode therein when turned ON.

8. The filter of claim 6 wherein said biasing means includes a switching diode driver circuit responsive to a tuning voltage provided thereto.

9. The filter of claim 8 wherein said tuning voltage is provided to said switching diode driver circuit from a local oscillator.

10. The filter of claim 6 wherein said biasing means includes a switching diode driver circuit responsive to channel addressing outputs provided thereto.

11. The filter of claim 10 wherein said channel addressing outputs are provided by a microprocessor controlled channel addressing system.

12. The filter of claim 1 incorporated in a CATV system, wherein said CATV system includes a cable carrying CATV signals coupled to said input terminal and a signal converter including a mixer coupled to said output terminal.

13. The filter of claim 12 wherein said CATV system further includes a pre-amplifier coupled between said cable and said input terminal.

14. The filter of claim 12 wherein the frequency bands covered by said filter sections extend from approximately 50–500 MHz with each filter section covering approximately 1 octave.

15. The filter of claim 1 further including an input parallel grounded resonant circuit connected between said input terminal and ground and an output parallel grounded resonant circuit connected between said output terminal and ground, wherein said input and output parallel resonant circuits are tuned to a common resonant frequency between the lowest frequency band and the highest frequency band.

16. The filter of claim 1 further including a first parallel arrangement of series resonant circuits connected between said input terminal and ground and a second parallel arrangement of series resonant circuits connected between said output terminal and ground for providing enhanced out of band signal attenuation.

17. The filter of claim 16 wherein said first parallel arrangement includes first and second series resonant circuits and said second parallel arrangement includes third and fourth series resonant circuits, wherein said first and third series resonant circuits provide signal attenuation below the lowest passband of said switchable filter and said second and fourth series resonant circuits provide signal attenuation above the highest passband of said switchable filter.

18. The filter of claim 17 wherein each of said series resonant circuits includes at least one capacitor and at least one inductor.

19. The filter of claim 1 wherein the center frequencies of each successive frequency band increase approximately in a geometric progression.

20. A multi-section switchable filter having a plurality of triple tuned bandpass filter sections, one of said sections being active for passing an input signal having a frequency within any one of a plurality of frequency bands in providing a band filtered output signal and the remainder of said sections being inactive for rejecting input signals having frequencies in the remaining frequency bands, wherein said triple tuned sections are switched from an active to an inactive mode in accordance with the frequency band to be passed, each triple tuned section of said switchable filter comprising:

a series resonant input circuit to which the input signals are provided;

a grounded parallel resonant circuit coupled to said series resonant input circuit;

a series resonant output circuit coupled to said grounded parallel resonant circuit for providing said filtered output signal, wherein each combination of series resonant input, grounded parallel resonant and series resonant output circuits is tuned to a frequency within one of said plurality of frequency bands; and switch means coupled across each of said grounded parallel resonant circuits for rendering all but one of said triple tuned bandpass filter sections inactive in accordance with the frequency band to be passed, wherein the series resonant input and output circuits of the inactive triple tuned bandpass filter sections remain in circuit with the active triple tuned bandpass filter section and form notch circuits therewith for enhanced out of band rejection.

* * * * *